(12) United States Patent
Moon (10) Patent No.: US 7,977,683 B2
(45) Date of Patent: Jul. 12, 2011

(54) LIGHT EMITTING DEVICE

(75) Inventor: Yong Tae Moon, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 12/642,237

(22) Filed: Dec. 18, 2009

(65) Prior Publication Data

US 2010/0163902 A1  Jul. 1, 2010

(30) Foreign Application Priority Data

Dec. 26, 2008 (KR) .................. 10-2008-0134515

(51) Int. Cl.
  H01L 27/15 (2006.01)
  H01L 31/12 (2006.01)
  H01L 33/00 (2010.01)
(52) U.S. Cl. .................. 257/79; 257/E33.062
(58) Field of Classification Search .......... 257/13, 257/79, E33.062
  See application file for complete search history.

(56) References Cited

U.S. PATENT DOCUMENTS

| 7,105,857 B2 | 9/2006 | Nagahama et al. |
| 7,358,659 B2 | 4/2008 | Cho |
| 2007/0034857 A1 | 2/2007 | Song |
| 2007/0120129 A1* | 5/2007 | DenBaars et al. .............. 257/79 |
| 2008/0197373 A1 | 8/2008 | Kim |

FOREIGN PATENT DOCUMENTS

| JP | 2003-243726 A | 8/2003 |
| JP | 2006-173506 A | 6/2006 |
| JP | 2007-109792 A | 4/2007 |
| KR | 10-2000-0021497 A | 4/2000 |
| KR | 10-2004-0005612 A | 1/2004 |
| KR | 10-2005-0088961 A | 9/2005 |
| KR | 10-2005-0093058 A | 9/2005 |
| KR | 10-0646634 B1 | 11/2006 |
| KR | 10-0652346 B1 | 11/2006 |
| KR | 10-2008-0053181 A | 6/2008 |

* cited by examiner

Primary Examiner — Thien F Tran
(74) Attorney, Agent, or Firm — Birch, Stewart, Kolasch & Birch, LLP (57) ABSTRACT

Disclosed is a light emitting device. The light emitting device includes a light emitting structure comprising an active layer to generate first light, a first conductive semiconductor layer on the active layer, and a second conductive semiconductor layer on the active layer so that the active layer is disposed between the first and second conductive semiconductor layers, wherein a portion of the light emitting structure is implanted with at least one element which generates second light from the first light.

2 Claims, 5 Drawing Sheets

LIGHT EMITTING DEVICE

The present application claims the benefit under 35 U.S.C. 119 of Korean Patent Application No. 10-2008-0134515, filed Dec. 26, 2008, which is hereby incorporated by reference in its entirety.

BACKGROUND OF THE INVENTION

The embodiments of the present invention relate to a light emitting device (LED). The LED is a semiconductor device that converts electric current into light. Since a red LED was commercialized, the red LED, together with a green LED, is used as a light source of electronic devices which includes information communication equipment.

For example, a gallium nitride (GaN) semiconductor, which is a nitride semiconductor, has high thermal stability and a wide bandgap. The GaN semiconductor can be combined with other elements, such as, In and Al to form a semiconductor layer that emits green, blue and/or white lights, and wavelengths of the emitted lights can be easily adjusted, so the GaN semiconductor has been spotlighted in the field of high-power electronic devices, such as LEDs.

A conventional nitride semiconductor LED is formed by combining a blue LED with a fluorescent substance. The fluorescent substance absorbs a part of the blue light to emit light having a color band of green, yellow and/or red. At the present time, such a fluorescent substance has low photoconversion efficiency and low reliability at high temperatures. Further, the fluorescent substance occupies a predetermined space on the blue LED, so a volume of the nitride semiconductor LED may be increased.

SUMMARY OF THE INVENTION

The embodiments of the present invention provide an LED capable of improving light emitting efficiency and diversifying application fields thereof.

The embodiments of the present invention provide an LED capable of achieving a white light output and having high performance.

According to an embodiment of the present invention, a light emitting device includes a light emitting structure comprising an active layer to generate first light, a first conductive semiconductor layer on the active layer, and a second conductive semiconductor layer on the active layer so that the active layer is disposed between the first and second conductive semiconductor layers, wherein a portion of the light emitting structure is implanted with at least one element which generates second light from the first light.

According to another embodiment of the present invention, a light emitting device includes an active layer to generate first light; a first conductive semiconductor layer on the active layer; a second conductive semiconductor layer on the active layer so that the active layer is disposed between the first and second conductive semiconductor layers; and a conductive substrate on the first conductive semiconductor layer, wherein a portion of the conductive substrate is implanted with at least one element which generates second light from the first light.

BRIEF DESCRIPTION OF THE DRAWINGS

FIG. 1 is a sectional view showing an LED according to a first embodiment of the present invention;

FIGS. 2 to 5 are sectional view showing a procedure for manufacturing an LED according to an embodiment of the present invention;

FIG. 6 is a sectional view showing an LED according to a second embodiment of the present invention;

FIGS. 7 and 8 are sectional view showing a procedure for manufacturing an LED according to another embodiment of the present invention; and FIG. 9 is a sectional view showing an LED according to a third embodiment of the present invention.

DETAILED DESCRIPTION OF THE EMBODIMENTS

Hereinafter, an LED and a method for manufacturing the same will be described with reference to the accompanying drawings.

In the description of embodiments, it will be understood that when a layer (or film) is referred to as being 'on/over' another layer or substrate, it can be directly on/over another layer or substrate, or intervening layers may also be present. Further, it will be understood that when a layer is referred to as being 'under/below' another layer, it can be directly under/below another layer, and one or more intervening layers may also be present. In addition, it will also be understood that when a layer is referred to as being 'between' two layers, it can be the only layer between the two layers, or one or more intervening layers may also be present.

First Embodiment

FIG. 1 is a sectional view showing an LED according to a first embodiment of the present invention. The LED according to the first embodiment includes a first conductive semiconductor layer 110, an active layer 120 and a second conductive semiconductor layer 130. Roughness R is formed at a first area of the first conductive semiconductor layer 110, and a portion 115 having an implanted element is in the first conductive semiconductor layer 110 having the roughness R. Reference numerals which are not described in FIG. 1 will be explained in the manufacturing method thereof. In embodiments of the present invention, the roughness R is a portion having a textured surface roughness. Such textured surface roughness may be at least one protrusion and/or at least one depression. The textured surface roughness may be a plurality of protrusions and depressions formed on a surface, or a portion thereof, and may have regular or irregular periodicity, or may be formed randomly. The shapes of the protrusions may be spine-like, column-like, or other shapes, and the shapes of the depressions may be indentations, channels, grooves, or other shapes.

According to the LED of the first embodiment, the implanted element may be rare earth elements that are partially implanted into a surface of the first conductive semiconductor layer 110, and a first electrode layer 150 is formed on the first conductive semiconductor layer 110 of high-quality, so that degradation in crystallization of a thin film caused by the implantation of the rare earth elements can be reduced or prevented, degradation in performance of the LED caused by degradation of electrical properties can be effectively reduced or solved, and a single chip white LED having high performance can be achieved. In other embodiments, the implanted element may be other elements, such as phosphor or other doping materials that have fluorescence or are able to absorb one light to generate another light. In a broad sense, an element refers to any element listed in the periodic table. It should be understood that light also references any radiation, as well as wavelength bands of light that are not visible to humans.

Figure 1:
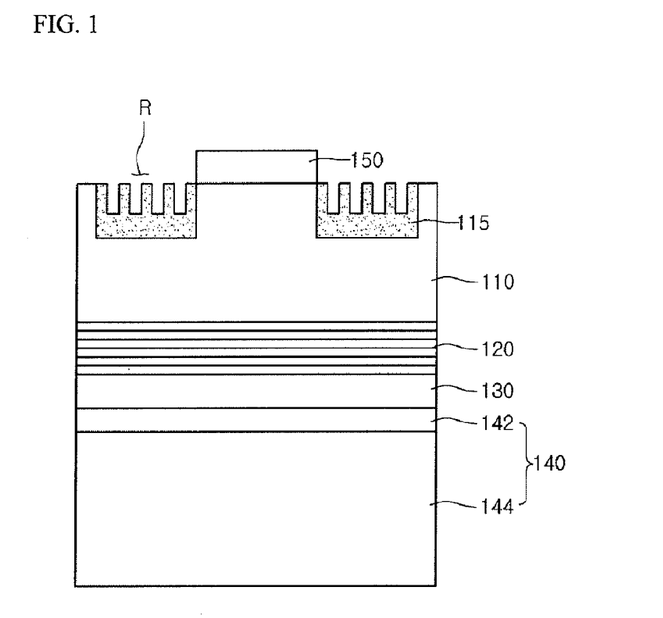
Figure 2:
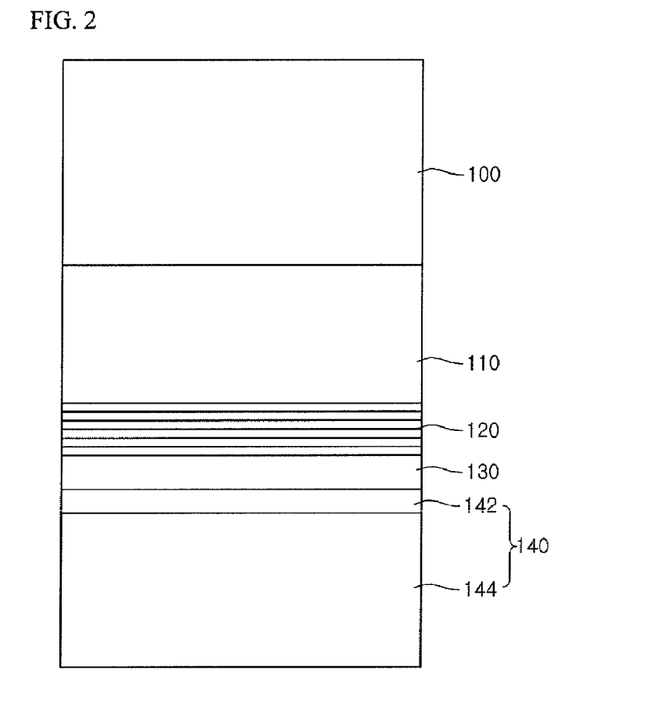

Hereinafter, the manufacturing method of the LED according to an embodiment of the present invention will be described with reference to FIGS. 2 to 5. First, as shown in FIG. 2, a first substrate 100 is prepared. The first substrate 100 may be a sapphire ($Al_2O_3$) single crystalline substrate. However, the present invention is not limited thereto. Wet cleaning is performed relative to the first substrate 100 to remove impurities on the surface of the first substrate 100.

Next, the first conductive semiconductor layer 110 can be formed over the first substrate 100. For example, the first conductive semiconductor layer 110 can be formed through chemical vapor deposition (CVD), molecular beam epitaxy (MBE) or hydride vapor phase epitaxy (HYPE). Further, the first conductive semiconductor layer 110 can be formed by injecting silane gas $SiH_4$ containing N type impurities, such as trimethylgallium gas TMGa, ammonia gas ($NH_3$), nitrogen gas $N_2$ and silicon Si, into a chamber containing the first substrate 100.

Then, the active layer 120 can be formed over the first conductive semiconductor layer 110. Electrons injected through the first conductive semiconductor layer 110 are combined with holes injected through the second conductive semiconductor layer 130 at the active layer 120, so the active layer 120 emits light having predetermined energy and/or wavelength, which is determined according to an energy band of material forming the active layer 120. The active layer 120 may have a quantum well structure formed by alternately laminating nitride semiconductor layers having different energy bands either once or several times. For example, the active layer 120 may have a multi-quantum well structure with an InGaN/GaN structure, which is formed by injecting trimethylgallium gas TMGa, ammonia gas $NH_3$, nitrogen gas $N_2$ and trimethylindium gas TMIn. However, the present invention is not limited thereto. Further, the active layer 120 may be formed at the temperature of about 760° C. to emit blue light. However, the present invention is not limited thereto.

Thereafter, the second conductive semiconductor layer 130 can be formed over the active layer 120. For example, the second conductive semiconductor layer 130 can be formed by injecting bis-ethylcyclopentadienyl magnesium ($EtCp_2Mg$) {$Mg(C_2H_5C_5H_4)_2$} containing P type impurities, such as trimethylgallium gas TMGa, ammonia gas $NH_3$, nitrogen gas $N_2$ and Magnesium Mg, into the chamber. However, the present invention is not limited thereto. In embodiments of the present invention, the first conductive semiconductor layer 110, the active layer 120, and the second conductive semiconductor layer 130 may be referred to as a light emitting structure.

Next, a second electrode layer 140 can be formed over the second conductive semiconductor layer 130. The second electrode layer 140 may include a second ohmic layer 142, a reflective layer, a coupling layer and a second substrate 144. For example, when the second electrode layer 140 includes the second ohmic layer 142, the second ohmic layer 142 can be formed by laminating single metal (or a metal alloy) and metal oxide in a multi-layer such that hole injection can be efficiently performed. For example, the second ohmic layer 142 may include at least one selected from the group consisting of ITO, IZO (In—ZnO), GZO (Ga—ZnO), AZO (Al—ZnO), AGZO (Al—Ga ZnO), IGZO (In—Ga ZnO), IrOx, RuOx, RuOx/ITO, Ni/IrOx/Au and Ni/IrOx/Au/ITO. However, the present invention is not limited thereto.

Further, when the second electrode layer 140 includes the reflective layer, the reflective layer may include a metal layer including Al, Ag, or an alloy of Al and Ag. The Al or Ag effectively reflects the light generated from the active layer 120 to significantly improve light extraction efficiency of the LED. When the second electrode layer 140 includes the coupling layer, the reflective layer may serve as the coupling layer. Further, the coupling layer may be formed using Ni, Au and the like.

Further, the second electrode layer 140 may include the second substrate 144. If the first conductive semiconductor layer 110 has a sufficient thickness of about 50 μm or more, a process for forming the second substrate 144 may be omitted. For example, the second substrate 144 may include metal (e.g. Cu) having superior electrical conductivity, a metal alloy (e.g. Cu alloy) or conductive semiconductor materials (e.g. Si, Mo and SiGe) such that the hole injection can be efficiently performed. The second substrate 144 can be formed using an electrochemical metal deposition method or a bonding method using eutectic metal.

Figure 3:
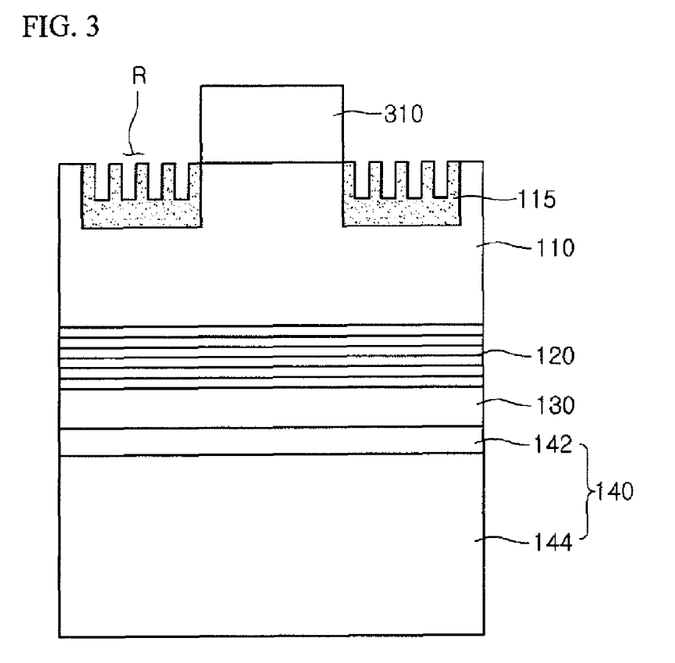

Then, as shown in FIG. 3, the first substrate 100 can be removed such that the first conductive semiconductor layer 110 is exposed. The first substrate 100 can be removed using high power laser or a chemical etching method. Further, the first substrate 100 can also be removed through physical polishing.

Thereafter, the roughness R can be formed on a part of the first conductive semiconductor layer 110. For example, a first pattern 310 is formed on the first conductive semiconductor layer 110. Subsequently, the part of the first conductive semiconductor layer 110 is etched by using the first pattern 310 as an etch mask to form the roughness R. Accordingly, the roughness R is formed.

For example, the first pattern 310 may include dielectric material such as silicon oxide or silicon nitride, and may have a thickness of about 0.5 μm to about 2 μm. However, the present invention is not limited thereto. The first pattern 310 may vary depending on a structure of the LED to be manufactured.

The first pattern 310 can be formed on an area in which a first electrode layer 150 is to be formed. Then, as shown in FIG. 3, the roughness R can be formed on the exposed first conductive semiconductor layer 110 by using the first pattern 310 as the etch mask. The roughness R is formed on the exposed first conductive semiconductor layer 110 to improve the light extraction efficiency of the LED. The surface of the exposed first conductive semiconductor layer 110 represents nitrogen polarization, so the roughness R can be formed through wet etching using a KOH solution. The roughness R can also be formed through dry etching.

Figure 4:
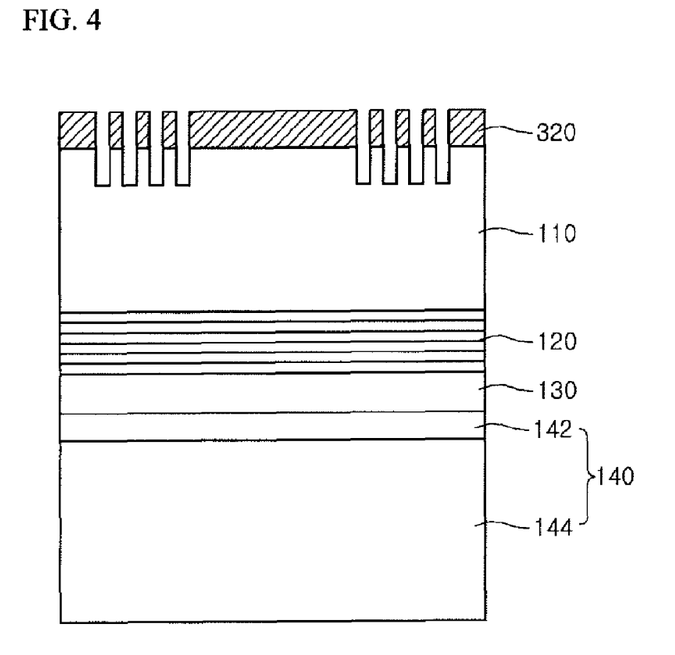

FIG. 4 shows another example of forming the roughness R on the part of the first conductive semiconductor layer. Material constituting the first pattern 310 may remain in an area having no roughness R and a second pattern 320 having holes may exist in the remaining area.

For example, the hole of the second pattern 320 may have a photonic crystalline structure like a cylinder. However, the present invention is not limited thereto. For example, when the hole of the second pattern 320 has a cylindrical shape, the hole may have a diameter of about 3 μm, and the distance between the holes may be about 2 μm. Then, as shown in FIG. 4, the roughness R can be formed on the exposed first conductive semiconductor layer 110 by using the second pattern 320 as the etch mask. For example, the first conductive semiconductor layer 110, which is exposed through the holes, may be dry-etched with a depth of about 0.5 μm through reactive ion etching (RIE).

Thereafter, the portion 115 having an implanted element is formed in the first conductive semiconductor layer 110 having the roughness R by using the first pattern 310 as the etch mask. The portion 115 having an implanted element may be formed before the roughness R is formed.

For example, the implanted elements may be any element. In an embodiment of the present invention, the implanted elements are rare earth elements that are implanted into the surface of the exposed first conductive semiconductor layer 110 having the roughness R. The rare earth elements may include Er, Eu, Pr, Tb, Dy, Ce, Sm, Gd, Ho, Yb, Lu, Nd, Pm, Tm and the like. The rare earth elements can be selected according to the wavelength of the light emitted from the active layer (light emitting layer). At least one kind of the rare earth elements can be implanted. The implantation amount of the rare earth elements may vary depending on properties of the white light of the LED. The rare earth elements can be implanted through ion implantation.

For example, Er (green) and Eu (red), which are rare earth elements, may be implanted into the surface of the exposed first conductive semiconductor layer 110 having the roughness R through the ion implantation at the temperature of about 200° C. to about 900° C. However, the present invention is not limited thereto.

Meanwhile, referring to FIG. 4, after the second pattern 320 is removed and a third pattern is formed on an area having no roughness R, the rare earth element implantation layer 115 may be formed by using the third pattern as an ion implantation mask. Then, the third pattern is removed to form the first electric layer 150.

Hereinafter, properties of the rare earth element implanted according to the embodiment will be described. In the rare earth element, 4f-electrons, which are partially filled in the rare earth element, are excited by external excitation light, and then the excited electrons return to a stable state through inner transition, so each rare earth element emits light having specific energy. Such rare earth elements may include Er, Eu, Pr, Tb, Dy, Ce, Sm, Gd, Ho, Yb, Lu, Nd, Pm, Tm and the like. Similarly to the rare earth elements, transition metal elements can emit light of specific energy. Accordingly, the implanted element may be one or more of the transition metal elements.

The rare earth elements, for example, can effectively emit light when the rare earth elements are doped in a crystal lattice serving as a host matrix and exist as a cation while occupying a cation site of the host matrix. Semiconductor host matrices including a nitride semiconductor may serve as a host matrix through which the rare earth elements can effectively emit light. The rare earth elements exist in the host matrix as the cation with an oxidation number of +2, +3 or +4. The electrons, which are partially filled in the 4f electron shell, are surrounded by 5s and 5p electron shells completely filled with electrons, so the electrons in the 4f electron shell are not significantly affected by a crystal field due to a shielding effect of outer shell electrons.

When intra-f optical transition of the rare earth ions occurs, light within the range of a visible ray can be emitted at the normal temperature. Ultraviolet light UV or light generated from a blue nitride semiconductor LED can be used for the excitation light.

The 4f electrons of the rare earth ions can perform f-f transition forbidden by parity selection rules and f-d transition permitted by the parity selection rules. For example, the f-f transition is observed in $Tb^{3+}$ (green), $Sm^{3+}$ (red), $Tm^{3+}$ (blue) and the like, and light emission through the f-d transition is observed in $Eu^{3+}$ (red), $Ce^{3+}$ (blue) and the like. Further, 5d electrons exist in the outermost shell, so the 5d electrons are easily affected by the crystal field and strongly dependent on the host matrix material.

In the case of $Eu^{3+}$ ions in a GaN host matrix, when electrons excited by the external excitation light perform inner shell transition, red light having a wavelength of 622 nm is emitted. Further, $Tb^{3+}$ ions can emit green light having a wavelength of 545 nm, $Er^{3+}$ ions can emit green light having a wavelength of 537 nm, $Pr^{3+}$ ions can emit red light having wavelengths of 645 nm and 652, and $Tm^{3+}$ ions can emit blue light having a wavelength of 450 nm.

For example, if ultraviolet (UV) light is irradiated onto the GaN thin film containing the rare earth elements such as Tm, Er and Eu, the rare earth elements emit blue, green and red lights, so white light can be emitted. If blue excitation light is irradiated onto the GaN thin film containing the rare earth elements such as Er and Eu, the rare earth elements absorb a part of the blue light to emit green and red lights, so white light can be emitted.

Figure 5:
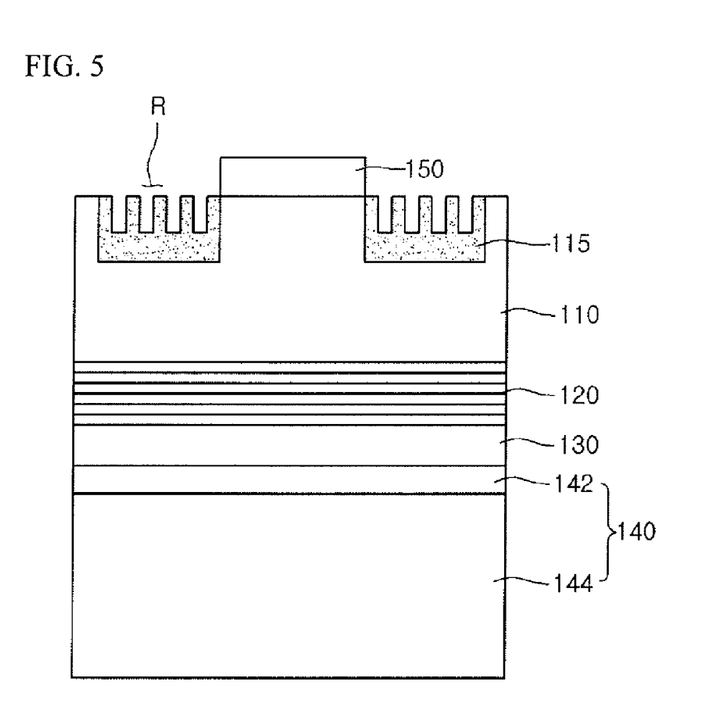

Next, as shown in FIG. 5, the first electrode layer 150 is formed on an area of the conductive semiconductor layer 110, where the rare earth element implantation layer 115 is not formed. For example, the first pattern 310 is removed and the first electrode layer 150 is formed on the exposed conductive semiconductor layer 110. The first electrode layer 150 may include a first ohmic layer, a reflective layer, a first electrode and the like. For example, when the electrode layer 150 includes the reflective layer, the reflective layer may include a metal layer containing Al, Ag, or an alloy of Al and Ag.

Further, when the electrode layer 150 includes the first ohmic layer, the first ohmic layer includes at least one selected from the group consisting of ITO, IZO (In—ZnO), GZO (Ga—ZnO), AZO (Al—ZnO), AGZO (Al—Ga ZnO), IGZO (In—Ga ZnO), IrOx, RuOx, RuOx/ITO, Ni/IrOx/Au and Ni/IrOx/Au/ITO. However, the present invention is not limited thereto. If the first ohmic layer is a transparent layer, since the emitted light can pass through the first ohmic layer, the reflective layer may be omitted.

According to the embodiment, the first electrode layer is formed on the high-quality N type nitride semiconductor layer, which has no rare earth elements and has superior electrical conductivity, so that the electrical properties of the LED can be improved. Then, a first electrode can be formed on the first ohmic layer.

According to the LED of the embodiment, the rare earth elements are partially implanted into the surface of the first conductive semiconductor layer and the first electrode layer is formed on the first high-quality conductive semiconductor layer, so degradation in crystallization of a thin film caused by the implantation of the rare earth elements can be prevented, and degradation in performance of the LED caused by degradation of electrical properties can be effectively solved, so that a single chip white LED having high performance can be achieved.

Further, the LED of the embodiment does not use the conventional fluorescent substance, so problems caused by the use of the fluorescent substance can be reduced or prevented and industrial application fields of the nitride semiconductor LED can be considerably diversified.

Second Embodiment

Figure 6:
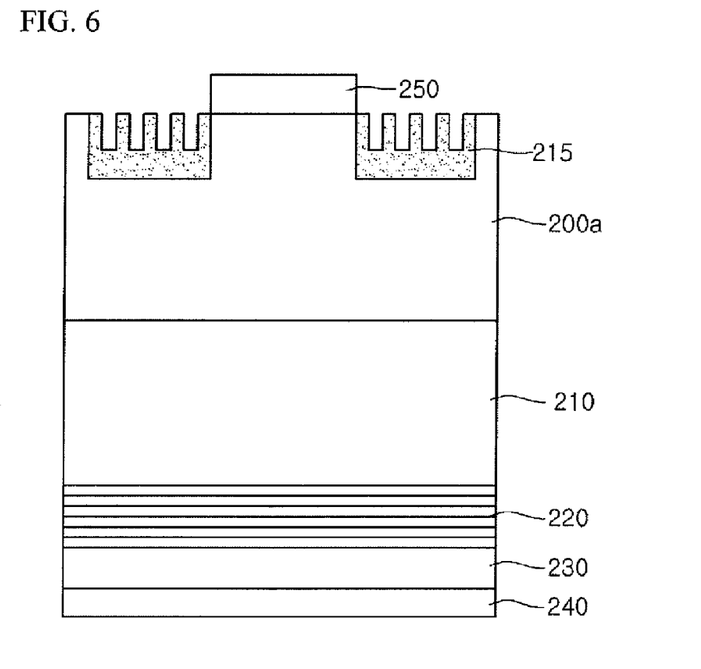

FIG. 6 is a sectional view showing an LED according to a second embodiment of the present invention. The LED according to the second embodiment can include a conductive substrate 200a, a first conductive semiconductor layer 210 formed on the conductive substrate 200a, an active layer 220 and a second conductive semiconductor layer 230.

Roughness R is formed at a part of the conductive substrate 200a, and an implanted element 215 is implanted in the conductive substrate 200a having the roughness R.

According to the second embodiment, the implanted element 215 can be partially implanted into the surface of the conductive substrate 220a and the first electrode layer 150 is formed on the conductive substrate 220a of high-quality, so degradation in crystallization of a thin film caused by the implantation of the rare earth elements can be reduced or prevented, degradation in performance of the LED caused by degradation of electrical properties can be effectively reduced or solved, and a single chip white LED having high performance can be achieved.

According to the second embodiment, the conductive substrate can be employed, the roughness can be formed on a part of the conductive substrate, and the implanted element can be implanted.

Hereinafter, the manufacturing method of the LED according to another embodiment of the present invention will be described with reference to FIGS. 6 to 8, with a focus on differences relative to that of the first embodiment. The second embodiment can adopt the technical characteristics of the first embodiment.

Figure 7:
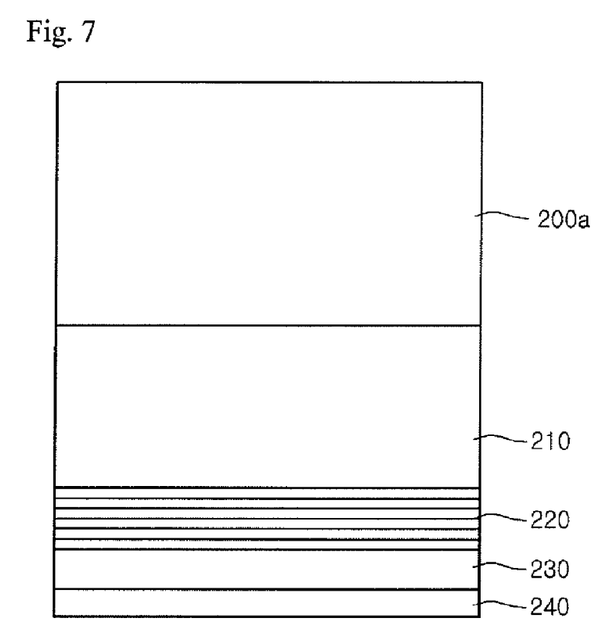

First, as shown in FIG. 7, the conductive substrate 200a can be prepared. The conductive substrate 200a has superior electrical conductivity and is transparent within the range of a visible ray. The conductive substrate 200a may include a single crystal substrate or a multicrystalline substrate containing GaN, gallium oxide $Ga_2O_3$, zinc oxide ZnO, silicon carbide SiC, metal oxide and the like.

Next, similarly to the first embodiment, the first conductive semiconductor layer 210, the active layer 220, the second conductive semiconductor layer 230 and a second electrode layer 240 can be formed on the conductive substrate 200a. The second electrode layer 240 may include a second ohmic layer, a reflective layer and the like.

Figure 8:
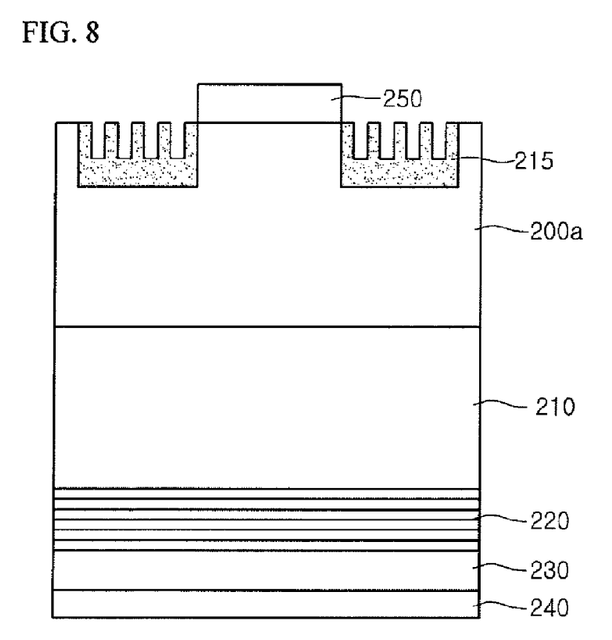

Then, a lower portion of the conductive substrate 200a (which is an upper portion of the conductive substrate 200a when viewed in FIG. 8) can be partially removed. For example, a polishing process is performed with respect to the lower surface of the conductive substrate 200a. Thickness of the conductive substrate 200a, which is thinned through the polishing process, may vary depending on products to which the semiconductor device is employed. For example, the conductive substrate 200a having a thickness of about 400 μm to about 500 μm can be subject to the polishing process, such that the conductive substrate 200a may have a thickness of about 70 μm to about 100 μm. However, the present invention is not limited thereto.

If a nitride semiconductor thin film is formed on the conductive substrate 200a through thin film growth equipment at the high temperature, the crystallization state of the lower surface of the conductive substrate 200a may be degraded due to high thin film growth temperature and reaction gases. In this regard, the electrical properties of the LED can be improved if the lower surface of the conductive substrate 200a is polished.

Thereafter, the roughness R can be formed on a part of the conductive substrate 200a, and the rare earth elements can be implanted into the conductive substrate 200a having the roughness R to form the rare earth element implantation layer 215. For example, a fourth pattern having a predetermined shape is formed on the high-quality conductive substrate 200a, which is exposed in a state in which the lower portion of the conductive substrate 200a is removed, the conductive substrate 200a is etched by using the fourth pattern as an etch mask, and then the rare earth elements are implanted by using the fourth pattern as an ion implantation mask. However, the present invention is not limited thereto.

Further, a layer of implanted elements 215, which may include one or more rare earth elements may be formed before the roughness R is formed on the part of the conductive substrate 200a.

According to the second embodiment, the rare earth elements can be partially implanted into the surface of the conductive substrate and the first electrode layer is formed on the high-quality conductive substrate, so degradation in crystallization of a thin film caused by the implantation of the rare earth elements can be reduced or prevented, degradation in performance of the LED caused by degradation of electrical properties can be effectively reduced or solved, and a single chip white LED having high performance can be achieved.

Then, the fourth pattern can be removed and the first electrode 250 can be formed on a predetermined area of the conductive substrate 200a, which has no roughness R. The first electrode 250 may include a first ohmic layer, a reflective layer, a first electrode and the like.

According to the second embodiment, the first electrode layer 250 is formed on the high-quality conductive substrate 200a, which has no rare earth elements and has superior electrical conductivity, so that the electrical properties of the LED can be improved.

According to the second embodiment, the rare earth elements can be partially implanted into the surface of the conductive substrate and the first electrode layer is formed on the high-quality conductive substrate, so degradation in crystallization of a thin film caused by the implantation of the rare earth elements can be reduce or prevented, degradation in performance of the LED caused by degradation of electrical properties can be effectively reduced or solved, and a single chip white LED having high performance can be achieved.

Figure 9:
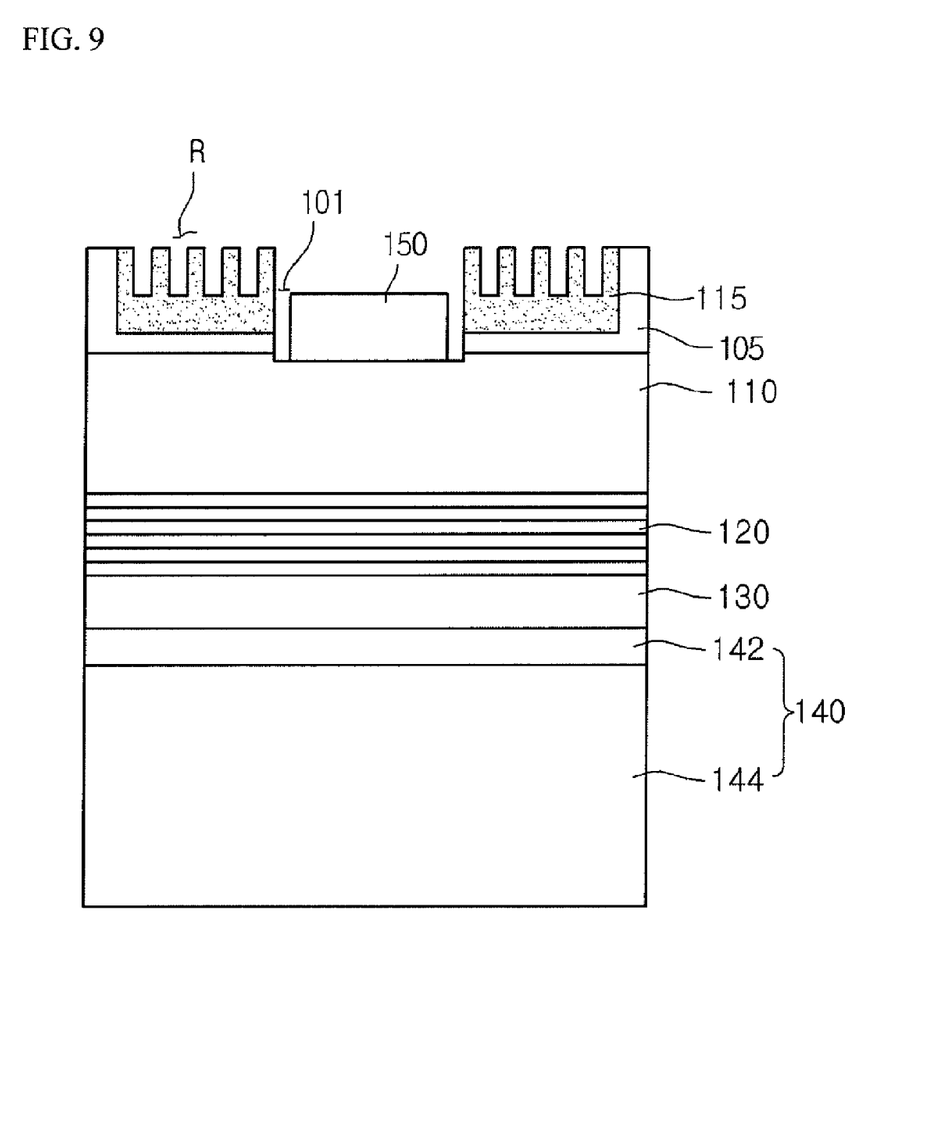

FIG. 9 is a sectional view showing an LED according to a third embodiment of the present invention. In discussing this embodiment, only differences with the first embodiment, for example, will be discussed for clarity and to avoid redundancy. Specifically, the LED includes an undoped semiconductor layer 105 formed on the first conductive semiconductor layer 110. A portion 115 having an implanted element is in the undoped semiconductor layer 105 having the roughness R. A first electrode layer 150 is formed on the first conductive semiconductor layer 110 within a cavity 101. In embodiments of the present invention, the undoped semiconductor layer 105, the first conductive semiconductor layer 110, the active layer 120, the second conductive semiconductor layer 130 may be referred to as a light emitting structure. Also, the undoped semiconductor layer 105 refers to a semiconductor layer that is not intentionally doped to be a conductive semiconductor, but may contain small amount of impurity is included unintentionally.

Further, the LED of the embodiments of the present invention do not use the conventional fluorescent substance, so problems caused by the use of the fluorescent substance can be reduced or prevented and industrial application fields of the nitride semiconductor LED can be considerably diversified.

In embodiments of the present invention, the roughness R is a portion having a textured surface roughness. Such textured surface roughness may be at least one protrusion and/or at least one depression. The textured surface roughness may be a plurality of protrusions and depressions formed on a surface, or a portion thereof, and may have regular or irregular periodicity, or may be formed randomly. The shapes of the protrusions may be spine-like, column-like, or other shapes, and the shapes of the depressions may be indentations, channels, grooves, or other shapes.

In embodiments of the present invention, the implanted element may be any element that have fluorescence or are able to absorb one light to generate another light. In a broad sense, an element refers to any element listed in the periodic table. It should be understood that light also references any radiation, as well as wavelength bands of light that are not visible to humans.

Any reference in this specification to "one embodiment," "an embodiment," "example embodiment," etc., means that a particular feature, structure, or characteristic described in connection with the embodiment is included in at least one embodiment of the disclosure. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the invention, the drawings and the appended claims. In addition to variations and modifications in the component parts and/or arrangements, alternative uses will also be apparent to those skilled in the art.

What is claimed is:

1. A light emitting device comprising:
a first conductive type semiconductor layer;
a rare earth element injection layer on a portion of the first conductive type semiconductor layer;
an active layer on the first conductive type semiconductor layer;
a second conductive type semiconductor layer on the active layer;
a second substrate on the second conductive type semiconductor layer, a first electrode layer on a region except a region in which the rare earth element injection layer is disposed; and
a first ohmic layer between the region except the region in which the rare earth element injection layer is disposed and the first electrode layer.

2. A light emitting device comprising:
a first conductive type semiconductor layer;
a rare earth element injection layer on a portion of the first conductive type semiconductor layer;
an active layer on the first conductive type semiconductor layer;
a second conductive type semiconductor layer on the active layer;
a second substrate on the second conductive type semiconductor layer,
a second ohmic layer between the second conductive type semiconductor layer and the second substrate; and
a second electrode layer on the second substrate.

* * * * *